United States Patent
Yatsu et al.

(10) Patent No.: US 7,157,362 B2
(45) Date of Patent: Jan. 2, 2007

(54) ELECTRONIC CIRCUIT UNIT AND METHOD OF FABRICATING THE SAME

(75) Inventors: Hiroyuki Yatsu, Fukushima-ken (JP); Nobuyuki Suzuki, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 11/020,618

(22) Filed: Dec. 21, 2004

(65) Prior Publication Data
US 2005/0140008 A1    Jun. 30, 2005

(30) Foreign Application Priority Data
Dec. 25, 2003 (JP) ............... 2003-429217
Oct. 19, 2004 (JP) ............... 2004-303909

(51) Int. Cl.
*H01L 21/44* (2006.01)

(52) U.S. Cl. ..................... 438/612; 257/777

(58) Field of Classification Search ............ 257/686, 257/777, 734–738, 743, E21.021, E23.02; 436/612–614, 617, 666; 361/600, 644, 719
See application file for complete search history.

(56) References Cited

U.S. PATENT DOCUMENTS 6,097,089 A * 8/2000 Gaku et al. ............. 257/712
6,222,246 B1 * 4/2001 Mak et al. ............... 257/532
6,278,180 B1   8/2001 Mizushima et al.
6,838,775 B1 * 1/2005 Takahashi ................ 257/778
6,952,049 B1 * 10/2005 Ogawa et al. ........... 257/700
2003/0038366 A1 * 2/2003 Kozono .................... 257/723
2004/0021218 A1 * 2/2004 Hayama et al. .......... 257/700
2004/0022038 A1 * 2/2004 Figueroa et al. ......... 361/763
2005/0230812 A1 * 10/2005 Przadka ................... 257/698

FOREIGN PATENT DOCUMENTS

JP    2000-307212    11/2000

* cited by examiner

*Primary Examiner*—Nathan W. Ha
(74) *Attorney, Agent, or Firm*—Brinks Hofer Gilson & Lione

(57) ABSTRACT

An electronic circuit unit contains electrodes to which bumps of a semiconductor chip are adhered. The electrodes are arranged on an upper surface of a circuit board. Land units to which chip parts is soldered are arranged on a rear surface of the circuit board. such that an insulating plate which is on the rear surface of the circuit board is supported by a supporting jig during a mounting process of the semiconductor chip, and the circuit board is not tilted. Therefore, an electronic circuit unit ensuring that the semiconductor chip is mounted with a reliable mounting capability can be obtained.

4 Claims, 3 Drawing Sheets

ELECTRONIC CIRCUIT UNIT AND METHOD OF FABRICATING THE SAME

This application claims the benefit of priority to Japanese Patent Application No. 2003-429217 filed on Dec. 25, 2003 and 2004-303909 filed on Oct. 19, 2004, both herein incorporated by reference.

BACKGROUND OF THE INVENTION

1. Field of the Invention

The present invention relates to an electronic circuit unit and a method of fabricating the same, for use in a local area wireless apparatus.

2. Description of the Related Art

With respect to a conventional electronic circuit unit and a method of fabricating the same, FIG. 8 is a cross-sectional view showing principal parts of the conventional electronic circuit unit, and FIG. 9 is an explanatory view illustrating the method of fabricating the conventional electronic circuit unit.

Next, an arrangement of the conventional electronic circuit unit will be described with reference to FIGS. 8 and 9. Wiring patterns 52 are formed on the front surface and the rear surface of a circuit board 51 which is composed of a plurality of stacked insulating sheets. In addition, a solder resist film 53 land units 52b and electrodes 52a exposed from the solder resist film 53 are formed on the wiring pattern 52.

With the solder resist film 53, regions of the electrodes 52a and the land units 52b are formed, and the wiring patterns 52 other than the exposed electrodes 52a and land unit 52b are prevented from being broken. In addition, since the solder resist film 53 is formed through printing or deposition of liquefied insulating material, the thickness of a film is not uniform such that an uneven film is formed.

Thus, on the front surface of the circuit board 51, bumps 55 arranged on a semiconductor chip 54 are pressed on the electrodes 52, and the semiconductor chip 54 is mounted on the circuit board 51 while chip parts 56 are soldered to the land unit 52b. In addition, on the rear surface of the circuit board 51, chip parts 57 are soldered to the land units 52 to form a desired electric circuit, so that the conventional electronic circuit unit is fabricated (See Japanese Unexamined Patent Application Publication No. 2000-307212).

A method of fabricating the conventional electronic circuit unit having the above-mentioned arrangement will be described with reference to FIG. 9. First, the solder resist film 53 to be formed on both sides of circuit board 51 is prepared. Next, as shown in FIG. 1, the solder resist film 53 on the rear surface of the circuit board 51 is placed on the supporting jig 61.

Here, since the thick film of the solder resist film 53 arranged on the back of the circuit board 51 is uneven, the circuit board 51 is supported such that the circuit board 51 is tilted against the surface of the supporting jig 61.

Next, the semiconductor chip 54 is carried onto the electrodes 52a through a mounting jig 62 for absorption and pressing, and the bumps 55 are heated and pressed down to the electrodes 52a by the mounting jig 62. Thus, the bumps 55 are adhered to the electrodes 52a, and then, the mounting jig 62 return to its original position.

In addition, the pressing of the bumps 55 to the electrodes 52a is performed while being tilted against the circuit board 51, such that some bumps are not sufficiently adhered to the electrodes 52a. As a result, the semiconductor chip 54 is not sufficiently mounted which leads to an unreliable mounting capability.

Therefore, after the semiconductor chip 54 is mounted, first, the chip parts 56 are soldered to the land unit 52b by using cream soldering arranged on the land units 52b. Next, the chip parts 57 are soldered to the land unit 52b by using cream soldering arranged on the land unit 52b to complete the fabrication process.

Specifically, according to the conventional electronic circuit unit and the method of fabricating the same, since the solder resist film 53 exists on the rear side of the circuit board 51, the circuit board 51 is tilted due to the unevenness of the thickness of the solder resist film 53 during the mount process of the semiconductor chip 54. As a result, the semiconductor chip 54 is not sufficiently mounted which leads to an unreliable mounting.

In the conventional electronic circuit unit and the method of fabricating the same, there is a problem in that, since the solder resist film 53 exists on the rear side of the circuit board 51, the circuit board 51 is tilted due to the unevenness of the thickness of the solder resist film 53 during the mount process of the semiconductor chip 54. As a result, the semiconductor chip 54 is not sufficiently mounted which reads to an unreliable mounting.

SUMMARY OF THE INVENTION

An object of the present invention is to provide an electronic circuit unit and a method of fabricating the same with a reliable mounting capability for mounting a semiconductor chip.

According to a first aspect of the present invention, there is provided a first aspect of an electronic circuit unit comprising a circuit board composed of a plurality of stacked insulating sheets, a semiconductor chip having a plurality of bumps, in which the plurality of bumps are attached to a plurality of electrodes of wiring patterns arranged on one surface of the circuit board, and chip parts soldered to a plurality of land units arranged on the other surface of the circuit board. The circuit board includes a wiring board having the plurality of electrodes arranged on the one surface and a plurality of conducting parts arranged on the other surface, and an insulating plate stacked on the other surface of the wiring board with covering the plurality of conducting parts. The land units connected to the conducting parts via connection conductors are arranged, without a solder resist film, on exposed surfaces of the insulating plate which is on the other surface of the circuit board.

Further, according to a second aspect of the present invention, a plurality of conductive patterns may be arranged on the other side of the wiring board, and the conducting parts may be formed as a part of the conductive patterns.

Further, according a third aspect of the present invention, the wiring board and the insulating plate constituting the circuit board may be made of low temperature co-fired ceramics.

Further, according to a fourth aspect of the present invention, the respective electrodes of the wiring patterns arranged on the one surface of the wiring board may be formed with the same area, and each of the electrodes may be attached to the bumps to connect the semiconductor chip.

Further, according to a fifth aspect of the present invention, there is provided a method of fabricating an electronic circuit unit. The method comprises a step of preparing a circuit board, in which the circuit board includes a wiring board having a plurality of electrodes of wiring patterns arranged on one surface and a plurality of conducting parts arranged on the other surface, and an insulating plate stacked on the other surface of the wiring board with covering the plurality of conducting parts. Land units are arranged, without a solder resist film, on an exposed surface of the insulating plate and connected to conducting parts through connection conductors. The method further comprises a step of mounting the exposed surface of the insulating plate having the land units on a supporting jig on the circuit board, a step of attaching plurality bumps arranged on a semiconductor chip to the electrodes, and a step of soldering chip parts to the land units.

Further, according to a sixth aspect of the present invention, the wiring board and the insulating plate constituting the circuit board may be made of low temperature co-fired ceramics.

According to the present invention, an electronic circuit unit comprises a circuit board composed of a plurality of stacked insulating sheets; a semiconductor chip having a plurality of bumps, in which the plurality of bumps are attached to a plurality of electrodes of wiring patterns arranged on one surface of the circuit board, and chip parts soldered to a plurality of land units arranged on the other surface of the circuit board. The circuit board comprises a wiring board having the plurality of electrodes arranged on the one surface and a plurality of conducting parts arranged on the other surface, and an insulating plate stacked on the other surface of the wiring board with covering the plurality of conducting parts. The land units connected to the conducting parts via connection conductors are arranged, without a solder resist film, on an exposed surface of an insulating plate which is on the other surface of the circuit board.

With the electronic circuit unit, since the land units connected to the chip parts are arranged on the exposed surface of the insulating plate provided on the rear side of the circuit board in a state where the solder resist film does not exist, the insulating plate where there does not exist the solder resist film can be supported by the supporting jig, and the tilt of the circuit board can be prevented. Therefore, it is ensured that the semiconductor chip is mounted with a reliable mounting capability.

In addition, since the conductive patterns are arranged on the rear side of the wiring board and the conducting parts are formed as a part of the conductive patterns, the wiring patterns on the circuit board are readily pulled, and the conductive patterns can be surely prevented from disconnection. Therefore, the circuit board having a high reliability can be obtained.

In addition, since the wiring board and the insulating plate constituting the circuit board are made of low temperature co-fired ceramics, the accuracy in the thickness of the circuit board is high and the circuit board having a high flatness of both sides can be obtained.

In addition, since the electrodes of the wiring patterns arranged on the one surface of the wiring board have the same area, respectively, and each of the electrodes is adhered to the bump, the electrode area can be identical, so that the area of the soldered bump can be uniformed. Accordingly, the semiconductor chip with a high mounting credibility can be obtained.

In addition, a method of fabricating an electronic circuit unit is provided. The method comprises a step of preparing a circuit board, in which the circuit board includes a wiring board having a plurality of electrodes of wiring patterns arranged on one surface and a plurality of conducting parts arranged on the other surface, and an insulating plate stacked on the other surface of the wiring board, in which a plurality of land units are arranged, without a solder resist film, on an exposed surface of the insulating plate and connected to a plurality of conducting parts through connection conductors. The method further comprises a step of mounting the exposed surface of the insulating plate on the circuit board, having the land units on a supporting jig, a step of attaching plurality bumps arranged on a semiconductor chip to the electrodes, and a step of soldering chip parts to the land units.

With the above method, since the land units connected to the chip parts are arranged, without the solder resist film thereon, on the exposed portion of the insulating plate on the other surface of the circuit board, the insulating film where the solder resist film does not exist is supported by the supporting jig during the mounting process of the semiconductor chip. In addition, the circuit board is not tilted against the surface of the supporting jig so that it is ensured that the semiconductor chip is mounted with a reliable mounting capability.

In addition, since the wiring board and the insulating plate constituting the circuit board are made of low temperature co-fired ceramics, the accuracy in the thickness of the circuit board is high and the circuit board having a high flatness of both sides can be obtained.

DESCRIPTION OF THE PREFERRED EMBODIMENT

Figure 1:
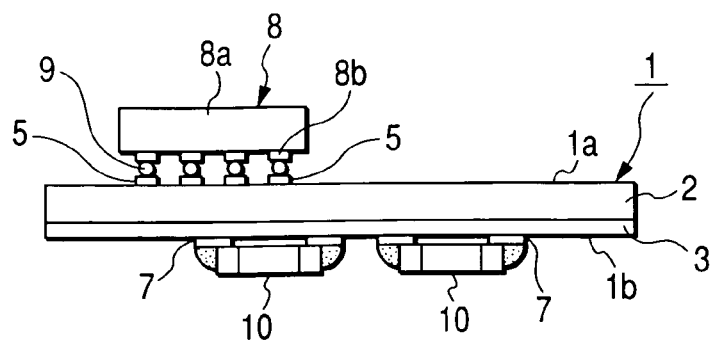
FIG. 1 is a front view of the electronic circuit unit of the present invention.
Figure 2:
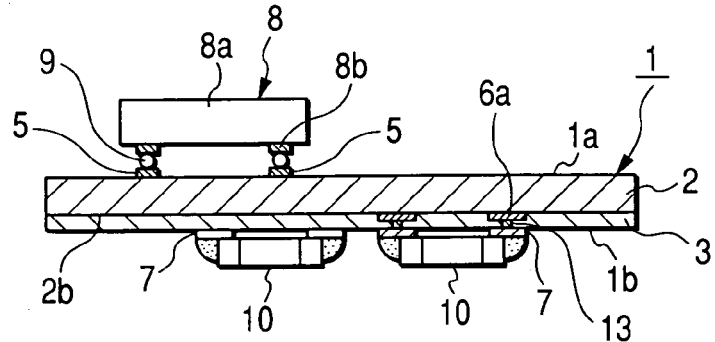
FIG. 2 is a cross-sectional view showing principle parts of the electronic circuit unit of the present invention.
Figure 3:
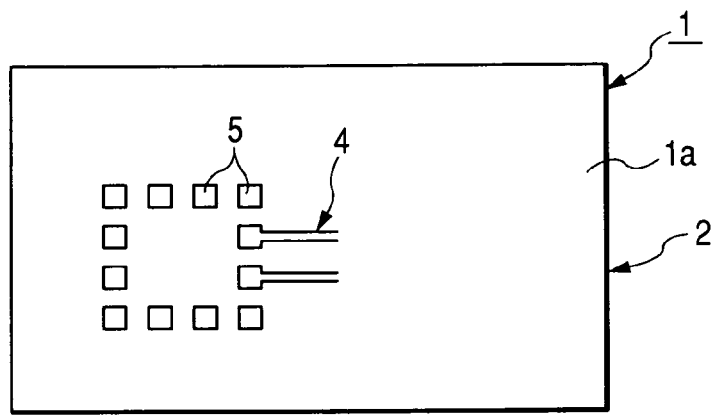
FIG. 3 is a plan view of a circuit board of the electronic circuit unit of the present invention.
Figure 4:
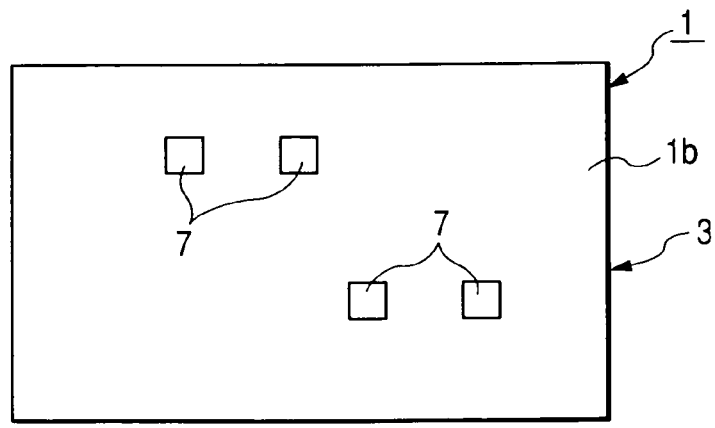
FIG. 4 is a bottom view of the circuit board of the electronic circuit unit of the present invention.

Drawing related an electronic circuit unit according to the present invention and a method of fabricating the same will be described. FIG. 1 is a front view of the electronic circuit unit of the present invention, FIG. 2 is a cross-sectional view showing principle parts of the electronic circuit unit of the present invention; FIG. 3 is a plan view of a circuit board of the electronic circuit unit of the present invention; and FIG. 4 is a bottom view of the circuit board of the electronic circuit unit of the present invention.

Figure 5:
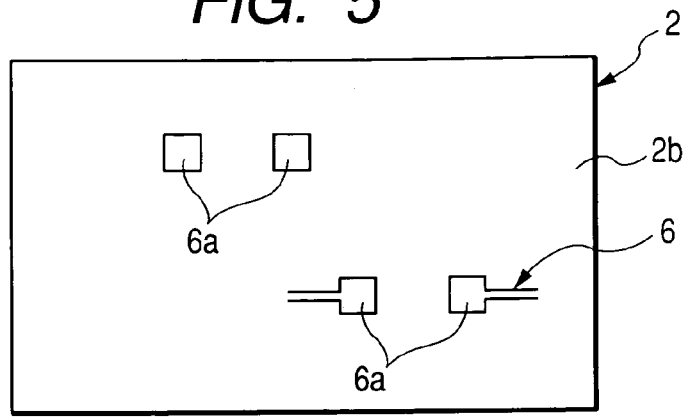
FIG. 5 is a bottom view of a wiring board constituting the circuit board according to the electronic circuit unit of the present invention.
Figure 6:
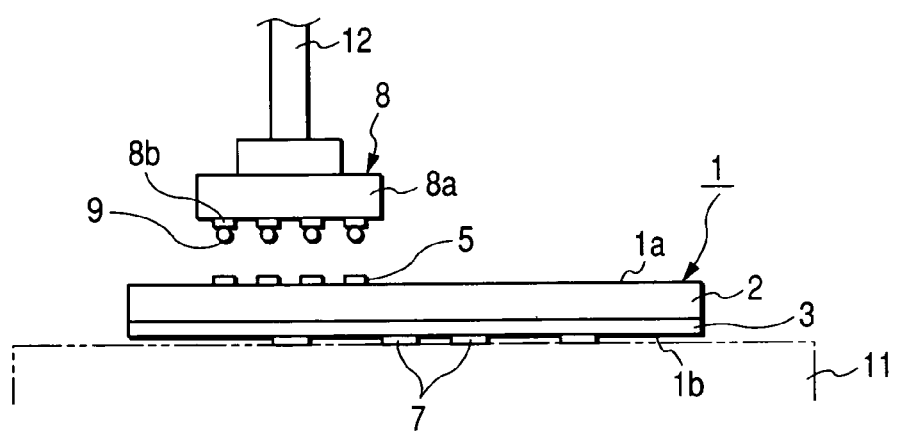
FIG. 6 is a diagram for illustrating a first step according to the method of fabricating the electronic circuit unit of the present invention.
Figure 7:
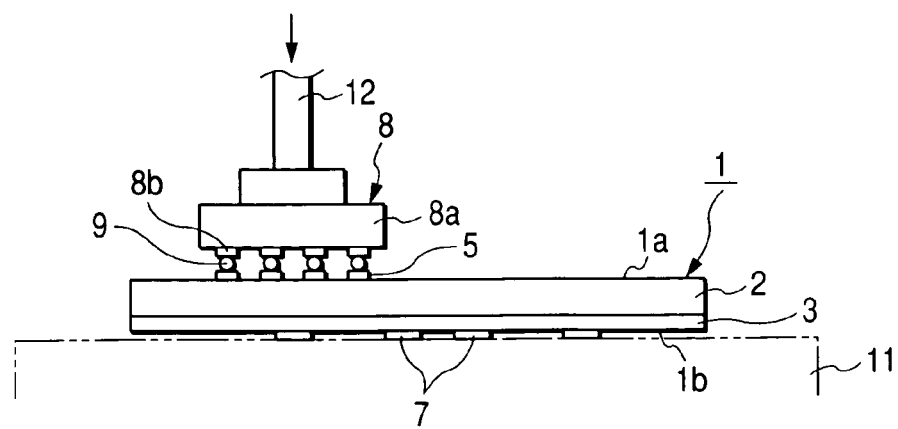
FIG. 7 is a diagram for illustrating a second step according to the method of fabricating the electronic circuit unit of the present invention.
Figure 8:
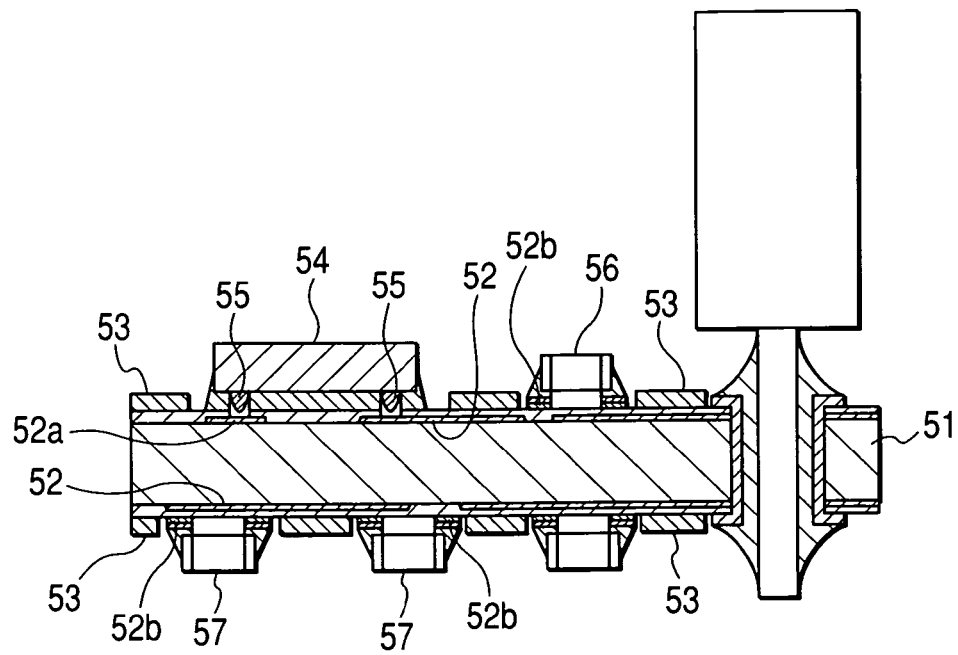
FIG. 8 is a cross-sectional view of the conventional electronic circuit unit.
Figure 9:
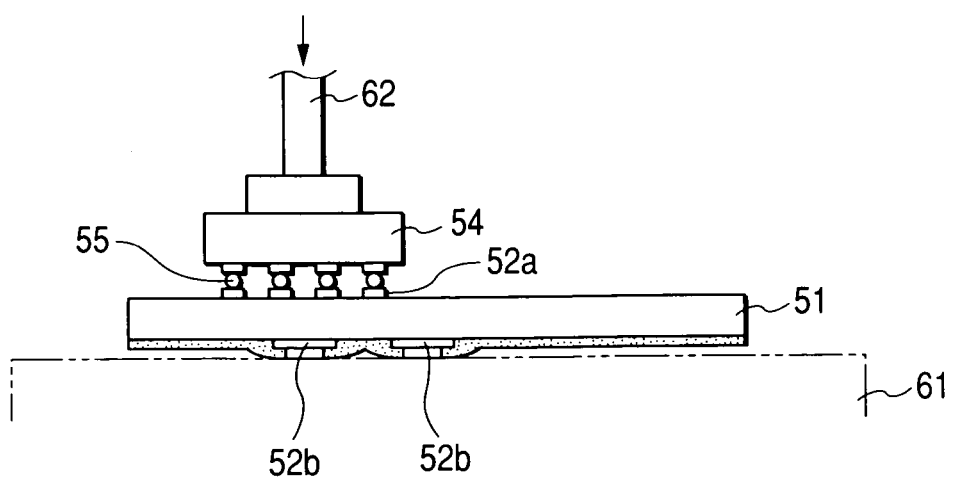
FIG. 9 is a diagram for illustrating a method of fabricating the conventional electronic circuit unit.

In addition, FIG. 5 is a bottom view of a wiring board constituting the circuit board according to the electronic circuit unit of the present invention, FIG. 6 is a diagram for illustrating a first step according to the method of fabricating the electronic circuit unit of the present invention, and FIG. 7 is a diagram for illustrating a second step according to the method of fabricating the electronic circuit unit of the present invention.

Next, an arrangement of an electronic circuit unit of the present invention will be described with reference to FIGS. 1 to 7. A circuit board 1 is composed of a plurality of insulating sheets made of low temperature co-fired ceramics (LTCC) or a resin, and includes a wiring board 2 arranged on an upper side and an insulating plate 3 stacked on the lower side of the wiring board 2.

In addition, on the circuit board 1 made of low temperature co-fired ceramics, since a green sheet is pressed and co-fired, it is possible to provide the circuit board 1 with a high precision.

On one surface (front surface) 1a of the circuit board 1 (upper surface of the wiring board 2), wiring patterns 4 and a plurality of electrodes 5 each having the same area and connected to the wiring patterns 4 are arranged, and at the same time, exposed regions of the electrodes 5 are formed by a solder resist film, though not shown, and the wiring patterns 4 are protected from dusts.

In addition, on an inner layer of the circuit board 1, i.e., the rear surface 2a of the wiring board 2 where the wiring board 2 and the insulating plate 3 contact, conductive patterns 6 are formed, as shown in FIG. 5, and conducting parts 6a which is formed as a portion of the conductive patterns 6 are also arranged. Here, the conductive patterns 6 and the conducting parts 6a are covered with the insulating plate 3.

Therefore, the conductive patterns 6 and the conducting parts 6a contact with the wiring patterns 4 arranged on the upper surface 1a, at appropriate positions.

In addition, on the other surface (rear surface) 1b of the circuit board 1 (the lower surface of the insulating plate 3) land units 7 are arranged, and the land units 7 are connected to the conducting parts 6a through connection conductors (through-holes) 13.

Specifically, the land units 7 are arranged on the lower exposed surface of the insulating plate 3, which is the rear surface 1b of the circuit board 1, without the solder resist film.

A semiconductor chip 8 composed of a flip chip and the like comprises a body unit 8a and a plurality of electrodes unit 8b arranged on the rear surface of the body unit 8a, and the electrodes unit 8b are pressed and adhered to bumps composed of balls and the like with soldering film on the outer surface.

Therefore, on the upper surface 1a of the circuit board 1, the bumps 9 arranged on the semiconductor chip 8 are pressed (attached) to the electrodes 5, such that the semiconductor chip 8 is mounted on the circuit board 1.

On the rear surface 1b of the circuit board 1, the chip part 10 composed of capacitors or resistors are soldered to the land units 7, such that the chip parts 10 are mounted on the circuit board 1.

However, although not shown herein, on the upper surface 1a of the circuit board 1, a desired electric circuit is formed, for example, the chip parts such as capacitors may be soldered to the wiring patterns 4, such that an electronic circuit unit of the present invention can be provided.

Next, a method of fabricating the electronic circuit unit having the above-mentioned arrangement will be described with reference to FIGS. 6 and 7. First, the circuit board 1 in which the wiring board 2 and the insulating plate 3 are stacked is prepared, and the land units 7 of the rear surface 1b of the circuit board 1 are mounted on a supporting jig 11, as shown in FIG. 6.

Here, since the solder resist film does not exist on the rear surface 1b of the circuit board 1, and thus, the land units 7 are arranged on the surface of the supporting jig 11 with a high precision, the circuit board is supported such that the circuit board 1 is parallel with the surface of the supporting jig 11.

Next, as shown in FIG. 6, by using a mounting jig 12 for absorption and pressing, the semiconductor chip 8 is carried on the electrodes 5. Then, as shown in FIG. 7, by moving the mounting jig 12 downwardly, the bumps 9 are pressed down and adhered to the electrodes 5.

Therefore, when the bumps 9 are pressed down to the electrodes 5 by the mounting jig 12 while being heated, the bumps 9 are adhered (attached) to the electrodes 5, and then, the mounting jig 12 returns to its original position.

Next, after the mounting of the semiconductor chip 8 is completed, the chip parts 10 are soldered to the land unit 7 using cream solder arranged on the land units 7 to complete the fabrication process.

Specifically, according to an electronic circuit unit of the present invention and a method of fabricating the same, since the land units 7 for connecting the chip parts 10 are arranged, without the solder resist film, on the exposed surface of the insulating plate 3 which is on the rear surface 1b of the circuit board 1, the insulating plate 3 where the solder resist film does not exist can be supported by the supporting jig 11 during the mounting process of the semiconductor chip 8, such that the circuit board 1 is not tilted. Therefore, it is ensured the semiconductor chip 8 is mounted with a reliable mounting capability can be obtained.

What is claimed is:

1. A method of fabricating an electronic circuit unit, comprising the steps of:
    preparing a circuit board comprising a wiring board having a plurality of electrodes of wiring patterns arranged on one surface and a plurality of conducting parts arranged on an opposing surface, and an insulating plate stacked on the opposing surface of the wiring board and covering the plurality of conducting parts,
    wherein land units are arranged, without a solder resist film, on an exposed surface of the insulating plate and are connected to the conducting parts through connection conductors,
    mounting the exposed surface of the insulating plate having the land units of the circuit board on a supporting jig;
    mounting a semiconductor chip on a mounting jig;
    arranging bumps on the semiconductor chip;
    moving the mounting jig downward toward the circuit board from an original position;
    pressing the bumps from the semiconductor chip onto the plurality of electrodes on the one surface of the circuit board while heating, whereby the bumps are adhered to the electrodes and the semiconductor chip is mounted onto the circuit board;
    returning the mounting jig to the original position; and
    soldering chip parts to the land units.

2. The method of fabricating the electronic circuit unit according to claim 1, wherein the wiring board and the insulating plate constituting the circuit board are made of low temperature co-fired ceramics.

3. The method of fabricating the electronic circuit unit according to claim 1, wherein the supporting jig supports the circuit board such that the circuit board is substantially parallel with the surface of the supporting jig.

4. The method of fabricating the electronic circuit unit according to claim 1, the chip parts are soldered to the land units with cream solder.

* * * * *

UNITED STATES PATENT AND TRADEMARK OFFICE
CERTIFICATE OF CORRECTION

PATENT NO. : 7,157,362 B2
APPLICATION NO. : 11/020618
DATED : January 2, 2007
INVENTOR(S) : Hiroyuki Yatsu et al.

It is certified that error appears in the above-identified patent and that said Letters Patent is hereby corrected as shown below:

On the Title Page

Column 2, line 3, after "6,838,775" delete "B1" and substitute --B2-- in its place.

Column 2, line 4, under "ABSTRACT", after "which chip parts" delete "is" and substitute --are-- in its place.

Column 2, line 5, under "ABSTRACT", immediately after "the circuit board" delete "." (period).

Signed and Sealed this

First Day of May, 2007

JON W. DUDAS
*Director of the United States Patent and Trademark Office*